(12) United States Patent
Yamaguchi et al.

(10) Patent No.: US 6,943,389 B2
(45) Date of Patent: Sep. 13, 2005

(54) SOLID-STATE IMAGING DEVICE

(75) Inventors: Tetsuya Yamaguchi, Tokyo (JP); Ryohei Miyagawa, Kyoto (JP); Yoshitaka Egawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/669,421

(22) Filed: Sep. 25, 2003

(65) Prior Publication Data

US 2004/0113180 A1 Jun. 17, 2004

(30) Foreign Application Priority Data

Sep. 26, 2002 (JP) ........................................ 2002-280881

(51) Int. Cl.[7] .............................................. H01L 27/148
(52) U.S. Cl. ...................... 257/229; 257/292; 257/249; 257/448; 257/459; 257/754
(58) Field of Search ................................. 257/229, 292, 257/249, 448, 459, 754

(56) References Cited

U.S. PATENT DOCUMENTS

| | | | | |
|---|---|---|---|---|
| 5,073,808 A | * | 12/1991 | Kinoshita | 257/231 |
| 5,255,099 A | * | 10/1993 | Orihara | 348/311 |
| 5,847,381 A | * | 12/1998 | Isogai | 250/208.1 |
| 6,633,334 B1 | * | 10/2003 | Sakurai et al. | 348/308 |

FOREIGN PATENT DOCUMENTS

| | | |
|---|---|---|
| JP | 2-5474 | 1/1990 |
| JP | 2-134992 | 5/1990 |
| JP | 3-165572 | 7/1991 |
| JP | 03-192764 | 8/1991 |
| JP | 8-288497 | 11/1996 |
| JP | 11-097662 | 4/1999 |
| JP | 2001-111022 | 4/2001 |
| JP | 2002-198505 | 7/2002 |

* cited by examiner

Primary Examiner—Jerome Jackson
(74) Attorney, Agent, or Firm—Oblon, Spivak, McClelland, Maier & Neustadt, P.C.

(57) ABSTRACT

A solid-state imaging device comprises an image pickup unit having unit cells including opto-electrical converter elements, said unit cells being disposed in a two-dimensional array, a selection line made of polysilicon for selectively determining the unit cells in the same row within the image pickup unit, a read-out line made of polysilicon for reading out an electric charge accumulated in the opto-electrical converter elements of the unit cells in the same row within the image pickup unit, a signal line transmitting pixel signals produced from the unit cells in the same row within the image pickup unit, a reset line made of polysilicon for discharging the unit cells in the same row within the image pickup unit down to a desired voltage level, a driver circuit located on one side of the image pickup unit for supplying drive signals to the read-out line, the selection line, and the reset line, respectively, and a read-out auxiliary wiring disposed along at least the read-out line and electrically connected to the read-out line at a plurality of junctions, the read-out auxiliary wiring being of comparatively lower electric resistivity than the read-out line.

20 Claims, 10 Drawing Sheets

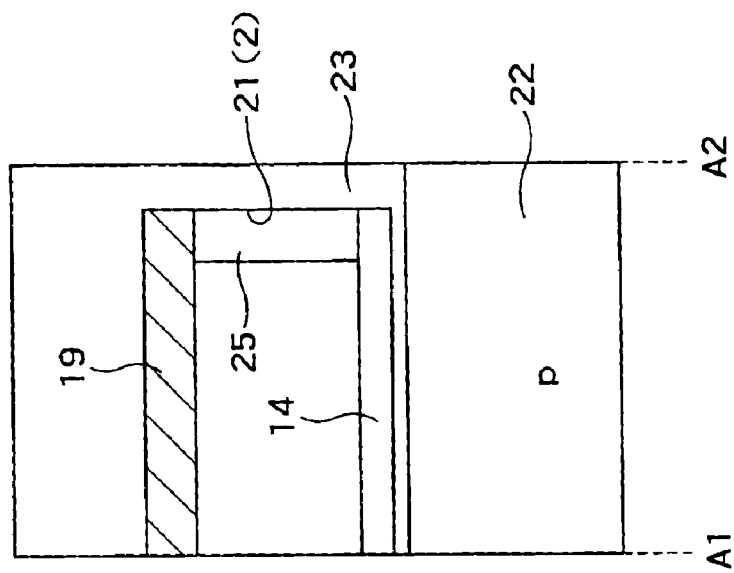
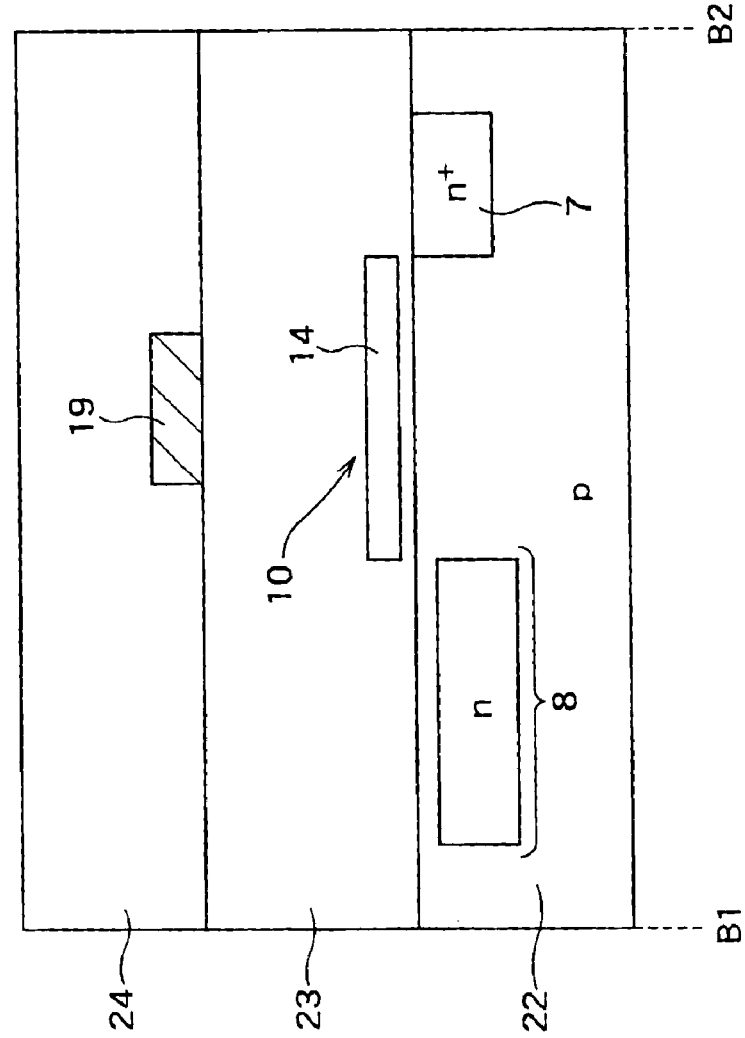
FIG. 3B
FIG. 3A

SOLID-STATE IMAGING DEVICE

CROSS REFERENCE TO RELATED APPLICATIONS

This application is based upon and claims the benefit of priority from the prior Japanese Patent Application No. 2002-280881, filed on Sep. 26, 2002; the entire contents of which are incorporated herein by reference.

BACKGROUND OF THE INVENTION

The present invention relates to a solid-state imaging device, and more particularly, it relates to a CMOS-sensor solid-state imaging device.

A CMOS sensor imaging device, for example, is provided with an image pickup unit (cell unit) that has pixels (unit cells) disposed in a two-dimensional array. The unit cells have an opto-electric converter element which receives incident light and converts it into electric charges and a part which amplifies the electric charges to transmit them. The material for signal wirings (interconnections) to respectively activate the image pickup unit configured of the pixels in a 2D array are generally made of polysilicon (poly-Si) doped with impurities.

However, a resistivity of the polysilicon changes considerably due to various factors such as an impurity doping condition, and is much higher than metal wirings in comparison, e.g., as high as $1.0 \times 10^{-3}$ $\Omega$cm.

Thus, pixels located far from a driving circuit (or a driver circuit), which supplies clock pulses to these pixels through the signal wirings, show significant voltage drop at the signal wirings as depicted in FIG. 10, and this prevents there being pulse voltage sufficient to activate the pixels. More specifically, the farther the pixels are from the driver circuit, the more reduced the amplitudes of the clock pulses transferred via the signal wiring, and the more transformed the waves. This in turn causes a problem of reduction of sensitivity in reading the electric charge in the pixels far from the driver circuit. This kind of drawback is defined as "shading".

To eliminate the drawback, as disclosed in Japanese Unexamined Patent Publication No. H02-5474, there has been an improved arrangement of thicker polysilicon wiring for transmission of clock pulses from a driver circuit to pixels with reduced resistance. In another arrangement, dual driver circuits are located on opposite flanks of an image pickup unit to develop clock pulses to pixels.

However, when increased in thickness, the polysilicon wiring takes up a larger area, which is disadvantageous in miniaturizing the resultant device. Additionally, the arrangement of the dual driver circuits on the opposite sides of the image pickup unit requires occupying an area large enough for two driver circuits, and this also prevents a miniaturization of the chip.

SUMMARY OF THE INVENTION

According to an embodiment of the present invention, there is provided a solid-state imaging device, comprising:

an image pickup unit having unit cells including opto-electrical converter elements, said unit cells being disposed in a two-dimensional array, a selection line made of polysilicon for selectively determining the unit cells in the same row within the image pickup unit, a read-out line made of polysilicon for reading out an electric charge accumulated in the opto-electrical converter elements of the unit cells in the same row within the image pickup unit, a signal line transmitting pixel signals produced from the unit cells in the same row within the image pickup unit, a reset line made of polysilicon for discharging the unit cells in the same row within the image pickup unit down to a desired voltage level, a driver circuit located on one side of the image pickup unit for supplying drive signals to the read-out line, the selection line, and the reset line, respectively, and a read-out auxiliary wiring disposed along at least the read-out line and electrically connected to the read-out line at a plurality of junctions, the read-out auxiliary wiring being of comparatively lower electric resistivity than the read-out line.

According to another embodiment of the present invention, there is provided a solid-state imaging device, comprising:

an image pickup unit having unit cells including first and second opto-electrical converter elements, said unit cells being disposed in a two-dimensional array, a selection line made of polysilicon for selectively determining the unit cells in the same row within the image pickup unit, first and second read-out lines made of polysilicon for reading out an electric charge accumulated in the first and second opto-electrical converter elements of the unit cells in the same row within the image pickup unit, a signal line transmitting pixel signals produced from the unit cells in the same row within the image pickup unit, a reset line made of polysilicon for discharging the unit cells in the same row within the image pickup unit down to a desired voltage level, a driver circuit located on one side of the image pickup unit for supplying drive signals to the first and second read-out lines, the selection line, and the reset line, respectively, first and second read-out auxiliary wirings disposed along at least the first and second read-out lines, respectively, and electrically connected to the first and second read-out lines, respectively, the first and second read-out auxiliary wirings being of comparatively lower electric resistivity than the first and second read-out lines, respectively.

According to a further embodiment of the present invention, there is provided a solid-state imaging device, comprising:

an image pickup unit having unit cells including opto-electrical converter elements, and a sensing unit to detect charges accumulated in the opto-electrical converter elements, said unit cells being disposed in a two-dimensional array, a selection line made of polysilicon for selectively determining the unit cells in the same row within the image pickup unit, a read-out line made of polysilicon for reading out an electric charge accumulated in the opto-electrical converter elements of the unit cells in the same row within the image pickup unit, a signal line transmitting pixel signals produced from the unit cells in the same row within the image pickup unit, a reset line made of polysilicon for discharging the unit cells in the same row within the image pickup unit down to a desired voltage level, a driver circuit located on one side of the image pickup unit for supplying drive signals to the read-out line, the selection line, and the reset line, respectively, and a read-out auxiliary wiring disposed along at least the read-out line and electrically connected to the read-out line at a plurality of junctions, the read-out auxiliary wiring being of comparatively lower electric resistivity than the read-out line;

said reset line and said read-out line being symmetrical about a sensing unit interpolated at their respective extensions of centers, and said read-out line and said selection line being symmetrical about the opto-electrical converter elements.

BRIEF DESCRIPTION OF THE DRAWINGS

FIG. 3 is a vertical cross-sectional view taken along the line A1-A2 and B1-B2 of FIG. 2;

DETAILED DESCRIPTION

Referring to the accompanying drawings, embodiments of the present invention will now be described in detail.

Figure 1:
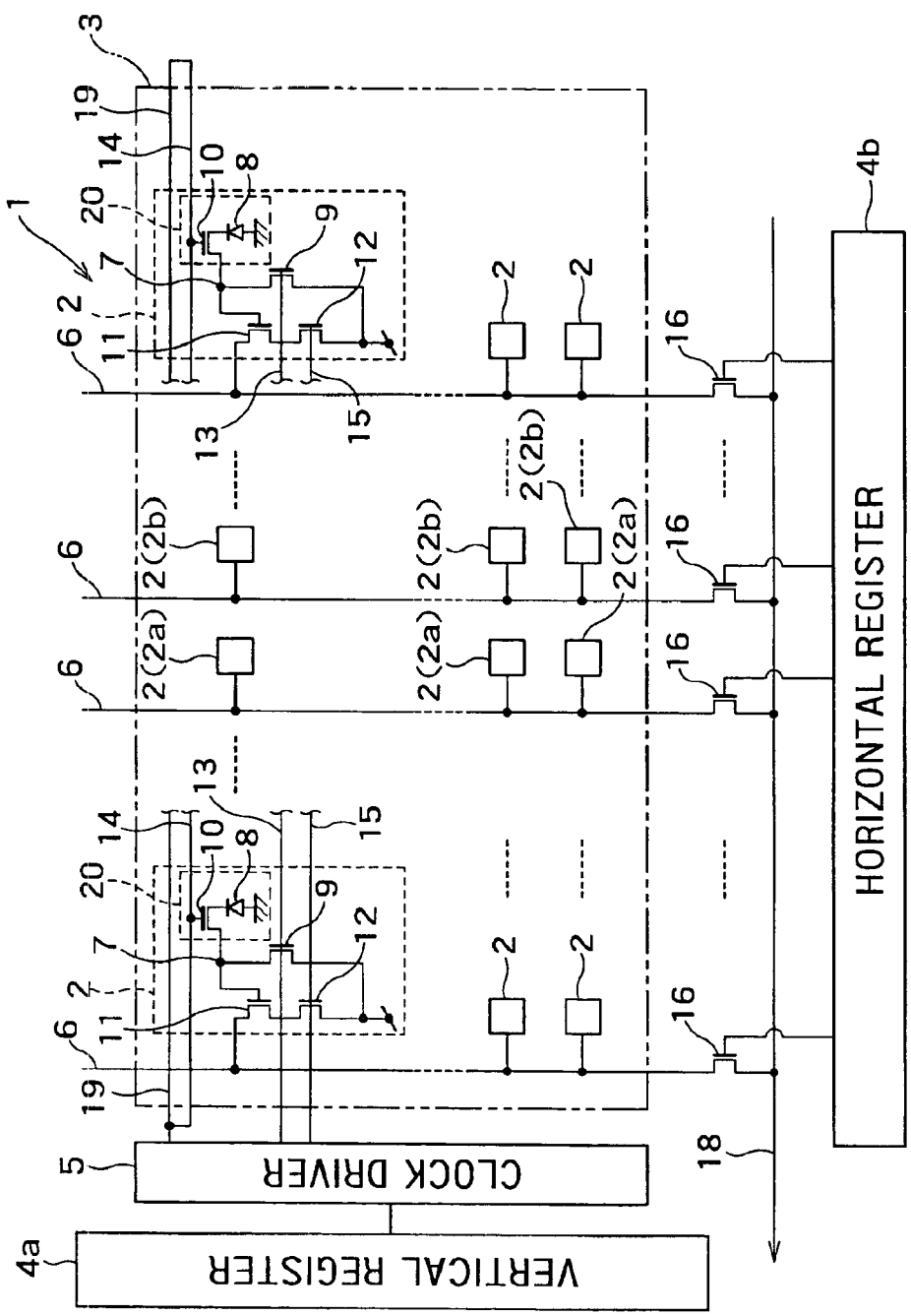
FIG. 1 is a diagram showing an equivalent circuit of a CMOS sensor provided as a first embodiment according to the present invention.

FIG. 1 is an equivalent circuit diagram showing an embodiment (first embodiment) of a CMOS sensor to which the present invention is applied.

As depicted in FIG. 1, a CMOS sensor 1 reads out electric charges accumulated in each of photodiodes (opto-electric converting elements) 8 by a driver circuit and transmits the electric charges via vertical and horizontal signal lines to sequentially output them externally.

First, a configuration of the CMOS sensor 1 will be explained.

The CMOS sensor 1 has a cell unit (image pickup unit) 3 that has a plurality of unit cells (pixels) 2 disposed in a two-dimensional array, the unit cells 2 having photodiodes 8. As can be seen, the pixels denoted by reference symbols 2a and 2b are those centered in the cell unit 3. The pixels 2 include a desired number (e.g., one) of the photodiodes 8 capable of accumulating received light from the outside and opto-electrically converting it into signals of an electric charge and accumulate them. Also, the pixels 2, as depicted in FIG. 1, have their respective signal detection circuitries each consisting of a desired number (e.g., four) of transistors 9, 10, 11 and 12. Thus, in this case, each of the signal detection circuitries has a reset transistor 9 used to discharge the pixel 2 to reduce the unnecessary charges, the read-out transistor to read out the electric charge accumulated in the photodiode 8, an amplification transistor 11 amplifying the readout electric charge from a read-out transistor 10 to produce pixel signals via vertical signal lines 6, and a vertical selection transistor 12 selectively determining which one(s) of the pixels should be accessed to read out the pixel signals.

A structure of the signal detection circuitry will be detailed below.

One end of the read-out transistor 10 is connected to a cathode of the photodiode 8 and the other end is connected to a sensing node (sensing unit) 7 which is an $n^+$ region, to detect the electric charge accumulated in the photodiode 8. An anode of the photodiode 8 is grounded. The sensing node 7 is connected to a gate electrode of the amplification transistor 11 to feed the detected electric charge from the sensing node 7 to the gate electrode of the amplification transistor 11. One end of the reset transistor 9 is connected to the sensing node 7 and the other end is connected to a predetermined reference potential. Configured in this manner, the reset transistor 9 allows the sensing node 7 and the photodiode 8 to discharge unnecessary charges remaining in the sensing node 7 and in the photodiode 8.

The vertical selection transistor 12 has its one end connected to the reference potential and the other end connected to one end (first end) of the amplification transistor 11. When turning on, the vertical selection transistor 12 feeds the reference potential to the end connected to the amplification transistor 11.

Within the cell unit 3, where pixels 2 each configured in the aforementioned manner have been disposed in a two-dimensional manner, there is provided a reset line 13 to which the reset transistors 9 in the same row have their respective gate electrodes connected in common. Also provided are a read-out line 14 to which the read-out transistors 10 in the same row have their respective gate electrodes connected in common, and a selection line (address line) 15 to which the vertical selection transistors 12 in the same row have their respective gate electrodes connected in common. The reset line 13, the read-out line 14, and the selection line 15 are all made of polysilicon doped with an impurity. In the cell unit 3, also, a plurality of vertical lines 6 are placed in parallel, one for each row of the pixels connected thereto in common, so as to transfer the pixel signals received from the photodiodes 8 in the pixels 2 and then amplified, to a horizontal signal line 18 in a lower portion of the cell unit 3, as illustrated in the figure.

In a left portion of the cell unit 3 as shown in the figure, a clock driver 5 is provided to feed clock pulses to the read-out line 14 and the selection line 15, respectively. The clock driver 5 is provided with a vertical resister 4a that functions to sequentially select the pixels 2 of the same row at a time. Specifically, the vertical resister 4a designates a row so as to activate the clock driver for the designated row, thereby supplying clock pulses to the associated activation lines. In parallel with a full extension of the read-out line 14 of high resistivity, aluminum auxiliary wiring 19 of relatively low resistivity is provided, which is electrically connected to the read-out line 14 at the outside of and at lateral sides of the cell unit 3. In this way, with the aluminum wiring of low resistivity being juxtaposed with the read-out line 14 of high resistivity and electrically connected with the same at their respective opposite ends, the read-out line 14 provides almost the same potential at the lateral ends of the cell unit 3, which permits supply of clock pulses of sufficient voltage and satisfactory waveform to all the transistors 10 connected to the read-out line 14.

In the lower part of the cell unit 3, the horizontal signal line 18 is provided to externally transfer the pixel signals that are read out from the pixels 2 in the same column to the vertical signal lines 6. The vertical signal lines 6 are connected to the horizontal signal line 18 by intervening horizontal selection transistors 16, and the horizontal selection transistors 16 have their respective gate electrodes connected to a horizontal register 4b that functions to selectively determine the horizontal selection transistors 16 in a sequence depending upon given clock pulses.

Now, an operation of the aforementioned device will be described.

First, the pixels 2 in the same selected row have their photodiodes 8 and sensing node 7 discharged down to a desired level. More specifically, the read-out transistors 10 and reset transistors 9 in the same selected row receive clock pulses produced from the clock driver 5 for a certain period of time to turn on this set of the read-out and reset transistors 10 and 9. This causes the photodiodes 8 to discharge the unnecessary charges via the read-out and reset transistors 10 and 9 and also causes the sensing node 7 to discharge the unnecessary charges via the reset transistors 9 to the reference potential coupled to the reset transistors 9.

Then, the photodiodes 8 are effected to receive light and opto-electrically convert the incident light into signals of the electric charges that are to be accumulated.

After that, the clock pulses from the clock driver 5 are applied to the selection lines 15 in the same selected row to turn on the vertical selection transistors 12 connected to the selection lines 15, respectively. Once the vertical selection transistors 12 are turned on, the reference potential at one end of each vertical selection transistor 12 is fed to the first end of the amplification transistor 11 connected to the other end of the transistor 12.

In addition, the accumulated electric charge in the photodiodes 8 of the pixels 2 in the same selected row are read out. More specifically, the clock pulses from the clock driver 5 are supplied to the read-out lines 14 in the same selected row for a certain period of time to turn on the read-out transistors 10 connected to the read-out lines 14, respectively. Once the read-out transistors 10 are turned on, the accumulated electric charge in the photodiode 8 connected to one end of each read-out transistor 10 is taken out via the transistor 10. As mentioned above, the read-out lines 14, which are connected to and shared by the read-out transistors 10, exhibit no voltage drop at their opposite ends by virtue of the aluminum auxiliary wiring 19 and retain almost the same potential at both ends, and hence, the read-out transistors 10 receive the clock pulses of sufficient voltage and satisfactory waveform to read out the accumulated electric charge in the photodiodes 8. As a consequence, the accumulated electric charge in each of the photodiodes 8 can be assuredly read out by each of the read-out transistors 10.

The readout result by the transistor 10 of the accumulated electric charge in the photodiode 8 is transferred to a gate of each of the amplification transistors 11 in the same selected row. In this way, a gate potential at the amplification transistor 11 in varied, and voltage signals based upon potential variations (i.e., pixel signals) are transmitted to the vertical signal line 6 connected to the other end (second end) of the amplification transistor 11.

The pixel signals transmitted from the amplification transistor 11 to the associated vertical signal line 6 are sequentially transferred to the horizontal signal line 18 via the associated horizontal selection transistor 16 connected to one end of the vertical signal line 6. Thus, the clock pulses from the horizontal register 4b connected to the plurality of the horizontal selection transistors 16 selectively determine sequence of the transistors 16 to which the pixel signals from the vertical signal lines 6 are sequentially fed to the horizontal signal line 18. The pixel signals sent from the vertical signal lines 6 to the horizontal signal line 18 are transferred to an intermediate component such as an amplification circuit not shown but connected to an export end of the horizontal signal line 18, and are eventually output externally.

Figure 2:
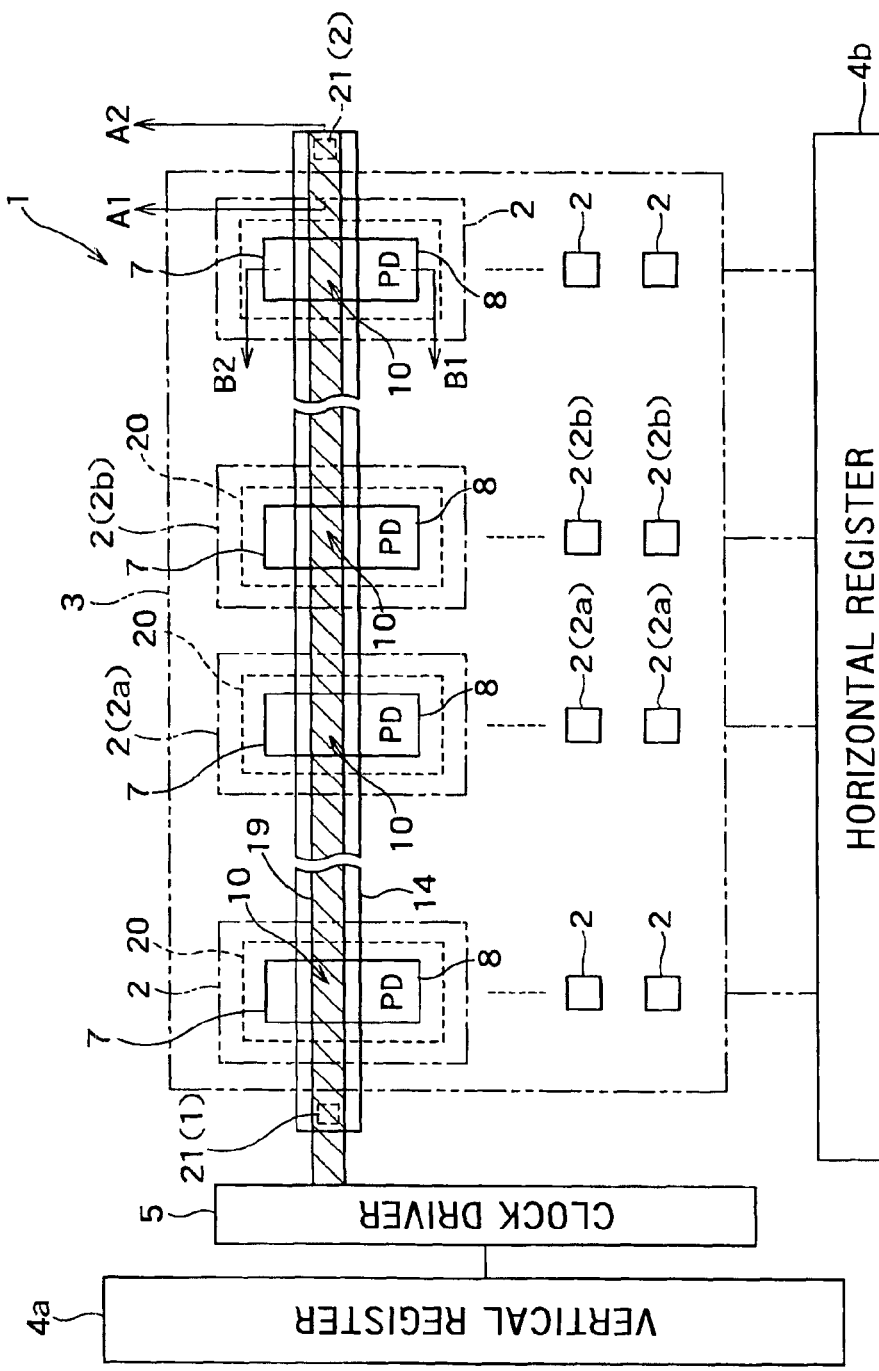
FIG. 2 is a plan view illustrating an exemplary configuration of a major portion of the CMOS sensor of FIG. 1.

FIG. 2 is a plan view showing an exemplary configuration of a major portion 20 with the aluminum auxiliary wiring of FIG. 1. FIG. 3A is a vertical cross-sectional view taken along the line B1-B2 of FIG. 2 while FIG. 3B is a vertical cross-sectional view taken along the line A1-A2.

As shown in FIG. 2, the read-out line 14 and the juxtaposed aluminum auxiliary wiring 19 along the full length of the same are electrically connected to each other, with contacts 21(1) and 21(2) being interposed at external lateral sides of the cell unit 3. This is specified in FIG. 3B showing a vertical cross-sectional along the line A1-A2 of FIG. 2 where the aluminum auxiliary wiring 19 along the full length of the readout line 14 has its one end electrically coupled to the same by a tungsten plug 25 that is embedded in silicon oxide film 23 serving as an interlayer insulation film. Also, the aluminum auxiliary wiring 19 has the other end electrically connected to the read-out line 14 in the similar manner. The aluminum auxiliary wiring is located at some interval above the read-out line 14 so as not to have adverse effects upon received light on the photodiodes 8, as depicted in FIG. 3A in a vertical cross-sectional along the line B1-B2 of FIG. 2. A configuration of the read-out transistor 10 in FIG. 3A will be outlined below.

The read-out line 14 is embedded in the silicon oxide film 23 above a region between the photodiode 8 and the sensing node 7 formed in the p substrate 22. The read-out line 14 also serves as gate electrodes of the read-out transistors 10. As stated above, the aluminum auxiliary wiring 19 is placed above the read-out line 14, with the intervening silicon oxide film 23, and in addition, silicon oxide film 24 overlies and covers the aluminum auxiliary wiring 19.

Figure 4:
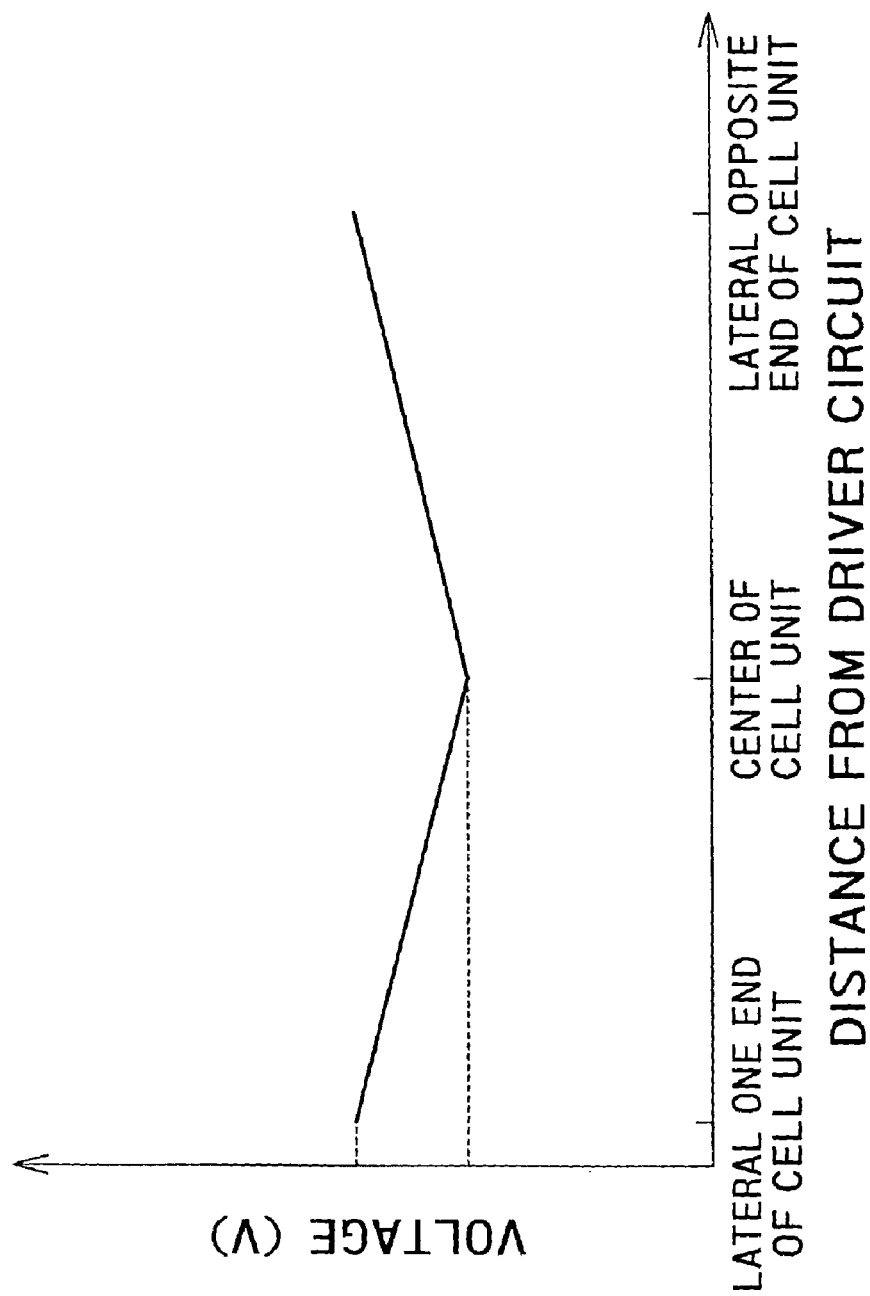
FIG. 4 is a graph showing a relation of a distance from a driver circuit to a level of voltage supply in a cell unit of the CMOS sensor.

In this structure where the read-out line 14 and the aluminum auxiliary wiring 19 are juxtaposed along their respective full lengths, a position where voltage of the clock pulses fed by the read-out line 14 drops the most is the center of the cell unit 3, as shown in FIG. 4. This will be described below in more detail.

Figure 10:
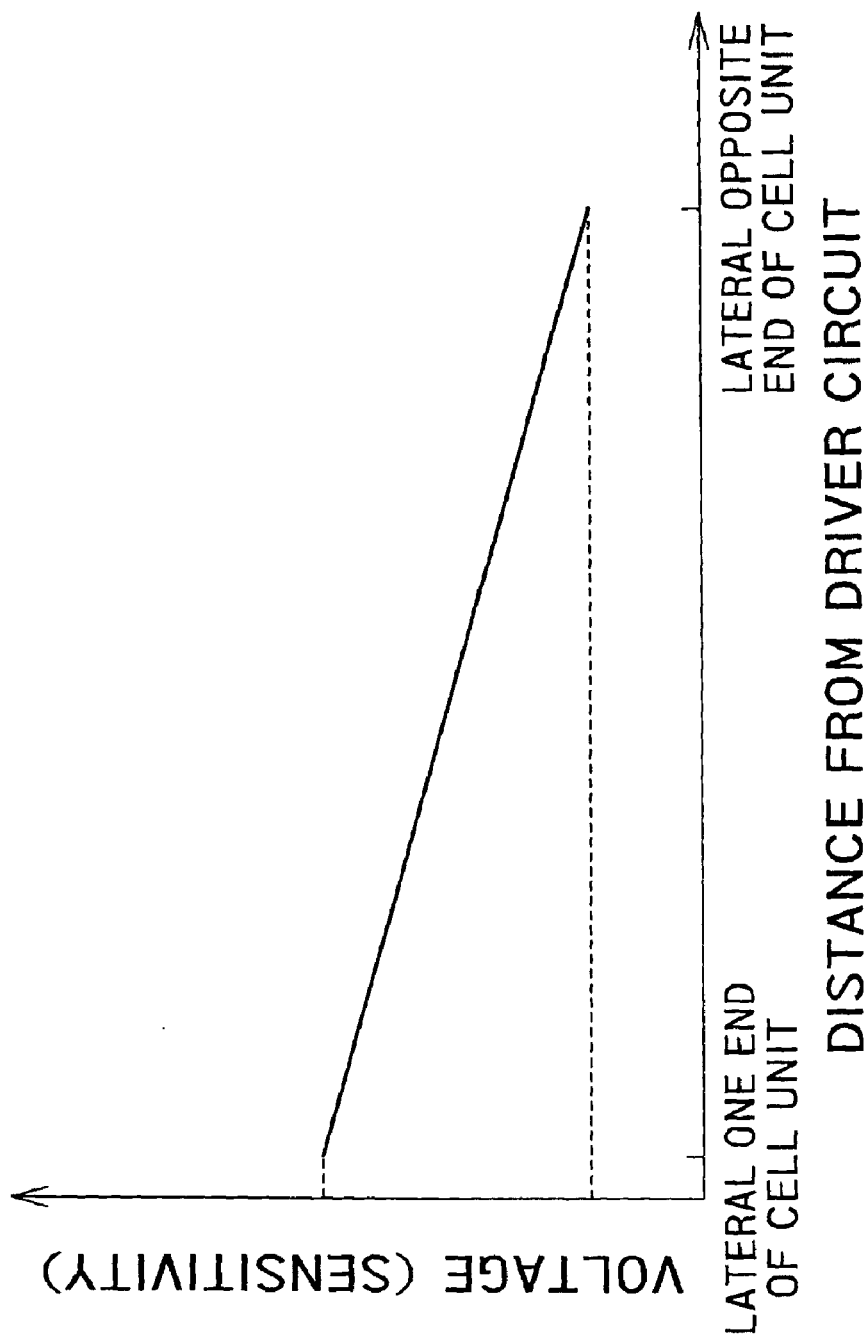
FIG. 10 is a graph illustrating a relation of a distance from a driver circuit to a level of voltage supply in a cell unit of the prior art CMOS sensor.

A resistivity of aluminum line extending along the read-out line 14 is relatively low, e.g., as low as $2.655 \times 10^{31}$ $^6$ 106 cm, and almost no voltage drop is observed throughout its full length. Thus, the read-out line 14 exhibits almost the same potential at its opposite ends in contact with the aluminum auxiliary wiring 19 and at the external lateral sides of the cell unit 3. Hence, voltage of the clock pulses transferred by the read-out line 14 drops the most in the mid point equidistant from the contacts 21(1) and 21(2) of the aluminum auxiliary wiring 19 with the read-out line 14 (see FIG. 2). This means that the pixels 2a and 2b centered in the cell unit 3 (see FIG. 1) are those that are supplied with the least voltage. The least voltage applied to the pixels 2a and 2b, as will be recognized in FIGS. 10 and 4, drops by approximately half, compared with that applied to pixels in the prior art CMOS sensor, and is sufficient to read out the electric charge.

As has been described, in an aspect of the first embodiment according to the present invention, since the read-out line 14 of high resistivity and the aluminum auxiliary wiring of low resistivity are juxtaposed along each other and electrically connected to each other at the external lateral sides of the cell unit 3, the device ensures almost the same features as are attainable in a device where the driver circuit is disposed on either of the lateral sides of the cell unit 3. Thus, the CMOS sensor of this invention can develop clock pulses retaining sufficient amplitude and square waveform even in the center of its cell unit, which usually encounters the largest degradation of the clock waveform. Resultantly, during the accelerated operation, signal transmission can be maintained appropriately. In addition to that, the aluminum auxiliary wiring is positioned right above the read-out line 14; that is, it is located in a position that does not affect light receiving efficiency in the photodiodes 8, and therefore, the light receiving efficiency in the photodiodes 8 would not be reduced significantly.

Although, in the aforementioned first embodiment, the aluminum auxiliary wiring 19 is provided in a position relative to the read-out line 14, it may similarly be in relation with the reset line 13 or the selection line 15. Especially, the reset transistor 9 connected to the reset line 13 requires relatively higher voltage as much as 2.8 V, for example, than the read-out transistor 10 of which drive voltage is 1 to 1.2 V. Thus, by electrically connecting the aluminum auxiliary wiring to the reset line 13 which requires a greater drive voltage, the resultant CMOS sensor can attain improved signal property effectively.

Figure 5:
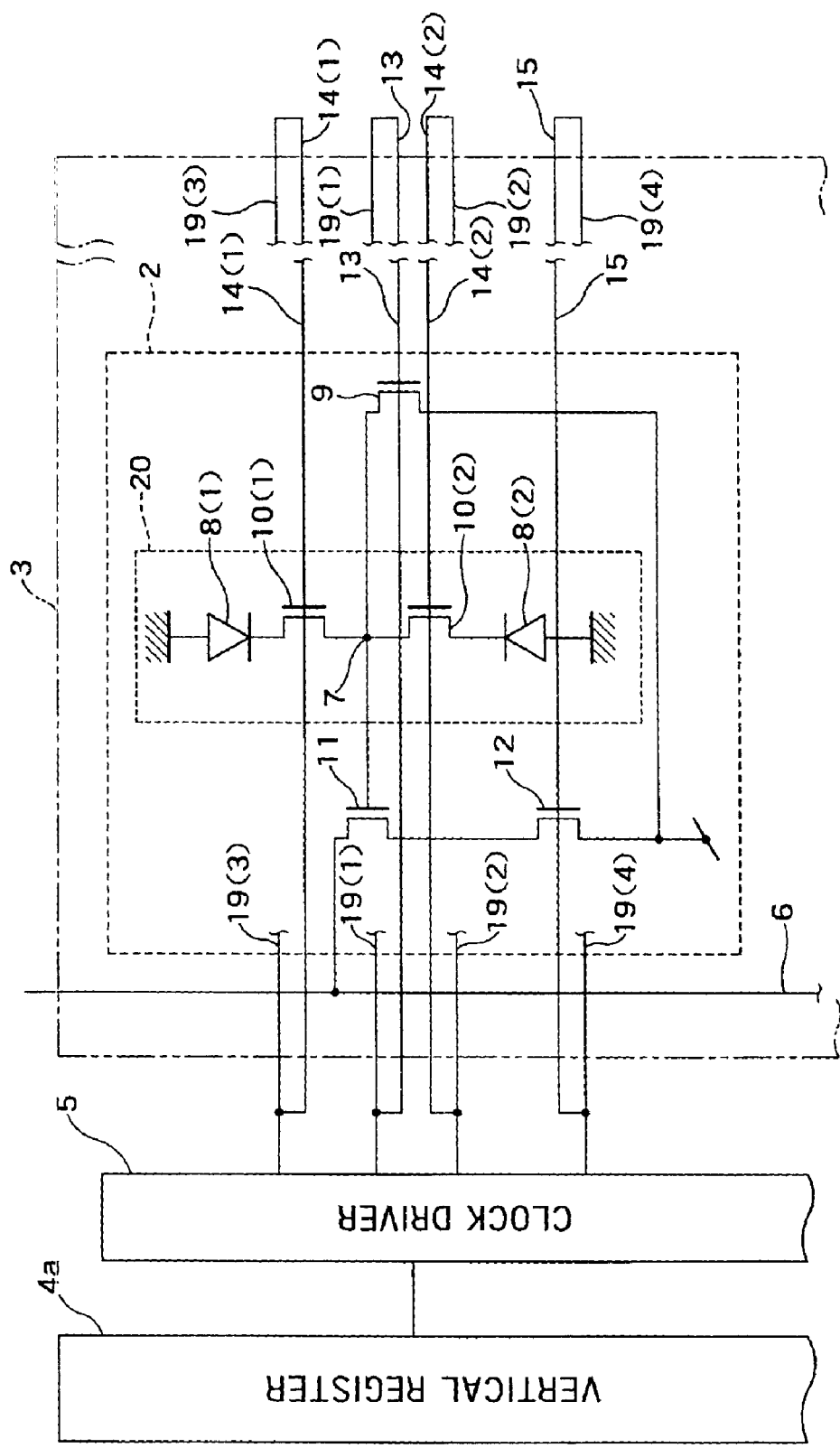
FIG. 5 is a diagram showing an equivalent circuit of a single pixel in the CMOS sensor provided as a second embodiment according to the present invention.

FIG. 5 is an equivalent circuit diagram showing an exemplary pixel in another type of the CMOS sensor to which the present invention is applied (or a second embodiment), making it distinguishable from the first embodiment. This CMOS sensor is one which has two photodiodes and two read-out transistors in each of the pixels. In this embodiment, an effective application of the present invention to such a CMOS sensor is intended to avoid adverse effect due to an incident angle of light upon the photodiodes in the pixel as much as possible.

Figure 6:
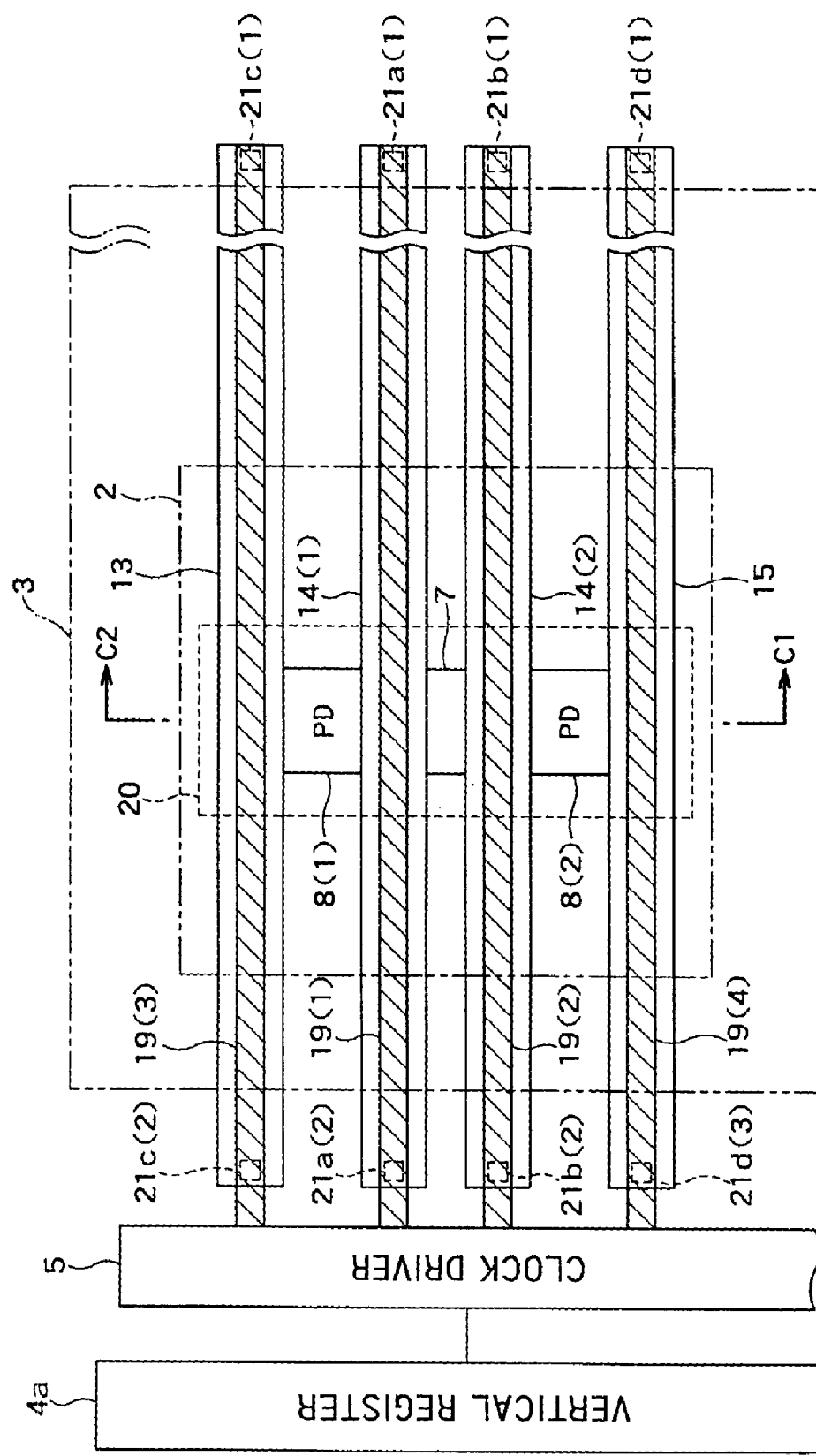
FIG. 6 is a plan view showing an exemplary configuration of a major portion of the single pixel of FIG. 5.
Figure 7:
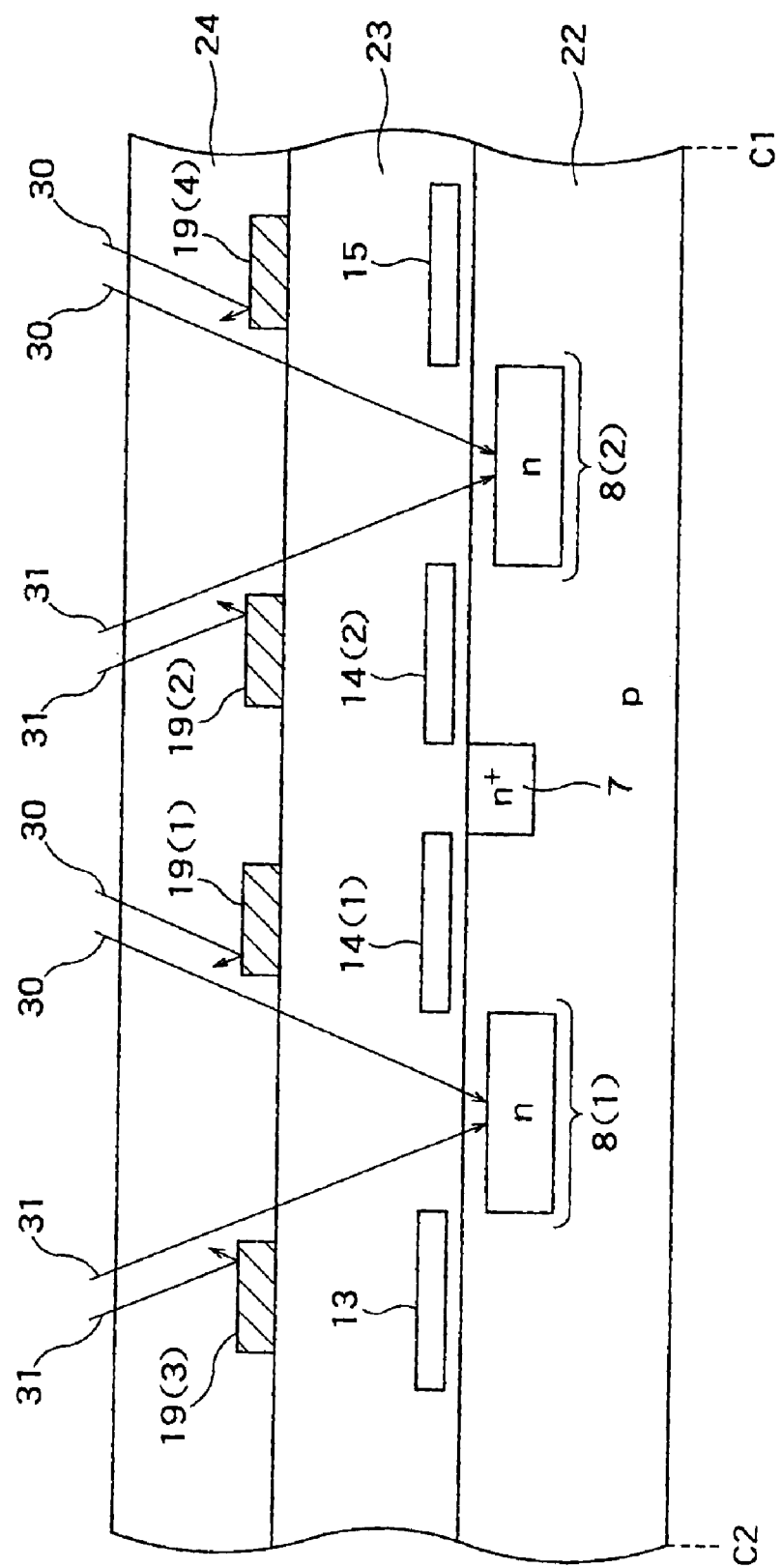
FIG. 7 is a vertical sectional view taken along the line C1-C2 of FIG. 6.

FIG. 6 is a plan view showing an exemplary structure of a major portion 20 of the pixel in FIG. 5 while FIG. 7 is a vertical cross-sectional view taken along the line C1-C2 of FIG. 6.

A configuration of pixels 2 of the CMOS sensor will be outlined below.

As depicted in FIG. 5, each of the pixels 2 has two photodiodes 8(1) and 8(2) serving as light receiving elements. Two read-out transistors 10(1) and 10(2) are provided to read electric charges accumulated in the two photodiodes 8(1) and 8(2). Two read-out lines 14 (1) and 14(2) are provided to activate the read-out transistors 10(1) and 10(2), respectively, which are commonly connected to a sensing node 7. Configured in this manner, the electric charges read out from the photodiodes 8(1) and 8(2), respectively, are synthesized in the sensing node 7 and fed as signals of electric charge to a gate of an amplification transistor 11 connected to the sensing node 7. Aluminum auxiliary wirings 19(1) to 19(4) are juxtaposed and electrically connected at lateral sides of the cell unit 3 with driving wirings that drive the pixels 2, namely, the read-out lines 14(1) and 14(2), the reset line 13, and, the selection line 15. The remaining components are similar in structure and operation to their respective counterparts depicted in FIG. 1, and descriptions of them are omitted.

The driving wirings, or the readout lines 14(1) and 14(2), and the reset line 13, and the selection line 15 are practically arranged as follows.

As shown in FIG. 6, the reset line 13 and the read-out line 14(1) are located symmetrically about the photodiode 8(1), and similarly, the read-out line 14(2) and the selection line 15 are about the photodiode 8(2). Thus, the aluminum auxiliary wirings 19(1) to 19(4) are respectively provided in a symmetrical deployment relative to the arrangement of the associated driving wirings. Also, as shown in FIG. 7, a group of the read-out lines 14(1) and 14(2), the reset line 13, and the selection line 15, and another group of the aluminum auxiliary wirings 19(1) to 19(4) are in the same hierarchy level, respectively. Configured in this manner where, about the photodiodes B(1) and 8(2) and their respective vertical extensions, structures on opposite sides are symmetrical, the adverse effect upon light receiving efficiency due to an incident angle of light on the photodiodes 8(1) and 8(2) can be avoided.

Specifically, as shown in FIG. 7, when light beam 30 directed from a certain direction is incident upon the photodiodes 8(1) and 8(2), the aluminum auxiliary wirings 19(1) and 19(4) along the optical path reflect (or shield) part of the light beam 30. Also, when directed from a direction almost symmetrically opposite to the beam 30 about a vertical center axis of each photodiode, another light beam 31 incident upon the photodiodes 8(1) and 8(2) is partly shielded like the light beam 30. Thus, the light receiving efficiency is almost even on lateral sides of the photodiodes 8(1) and 8(2) without adverse effect related to the incident angle of received light.

Without this structural symmetry about the photodiodes 8(1) and 8(2), the deposited interlayer insulation films 23 and 24 lack uniformity in thickness, being varied from a region overlying the wirings to a region without them, which would give adverse effects due to the incident angle of light. This would cause unevenness in sensitivity and lead to a degradation of optical properties and an eventual production of a poor quality image. From this point of view, the lateral structural symmetry about the photodiodes is effective in suppressing possible propagation of adverse effects due to the incident angle of light and avoiding a degradation of optical properties.

Figure 8:
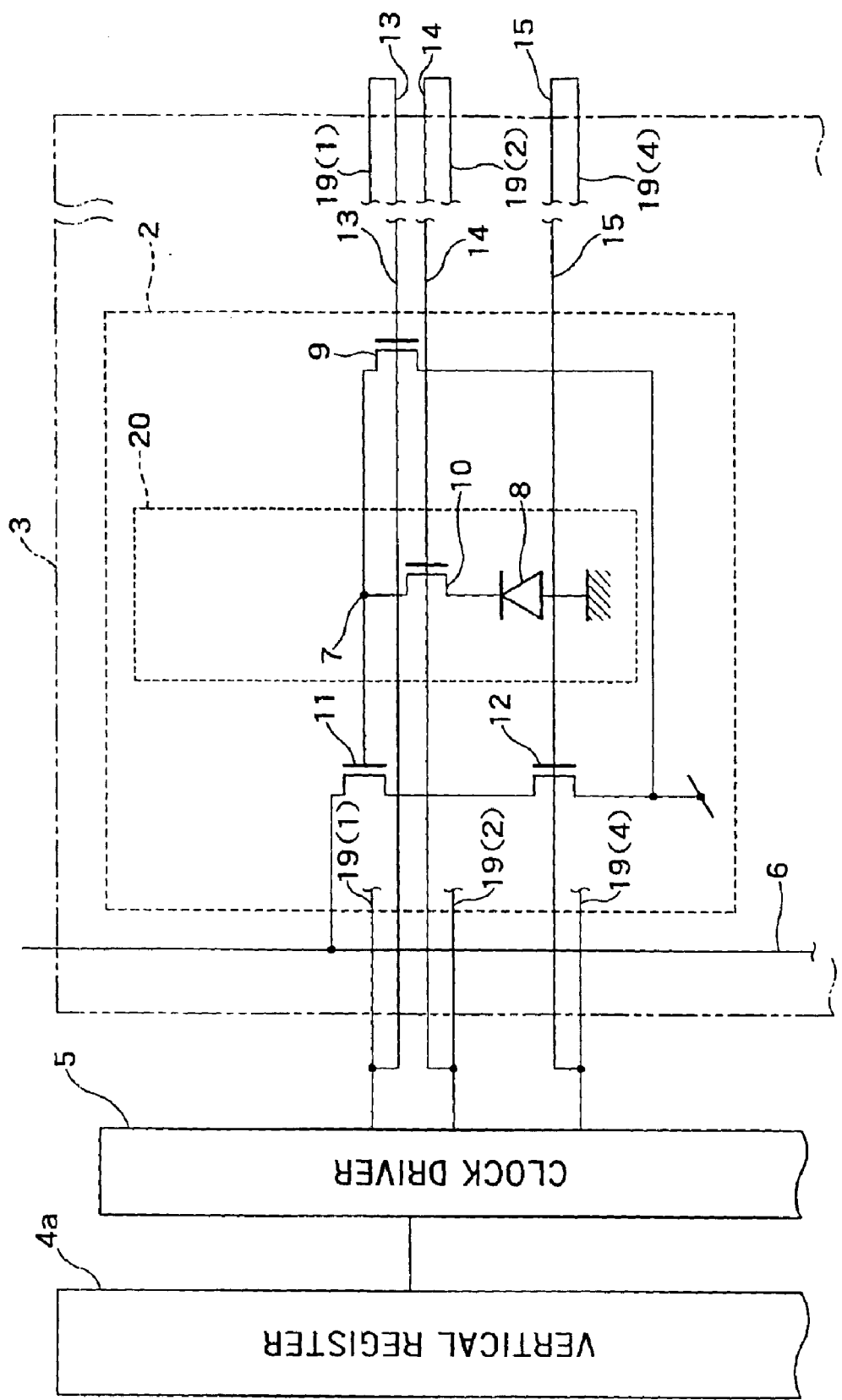
FIG. 8 is a diagram of an equivalent circuit showing a single exemplary pixel in the CMOS sensor provided as a third embodiment according to the present invention.

FIG. 8 is an equivalent circuit diagram showing an exemplary pixel in another type of the CMOS sensor to which the present invention is applied to make it (or a third embodiment) distinguishable from the first embodiment. This CMOS sensor has a single photodiode and a single read-out transistor in each of the pixels.

Figure 9:
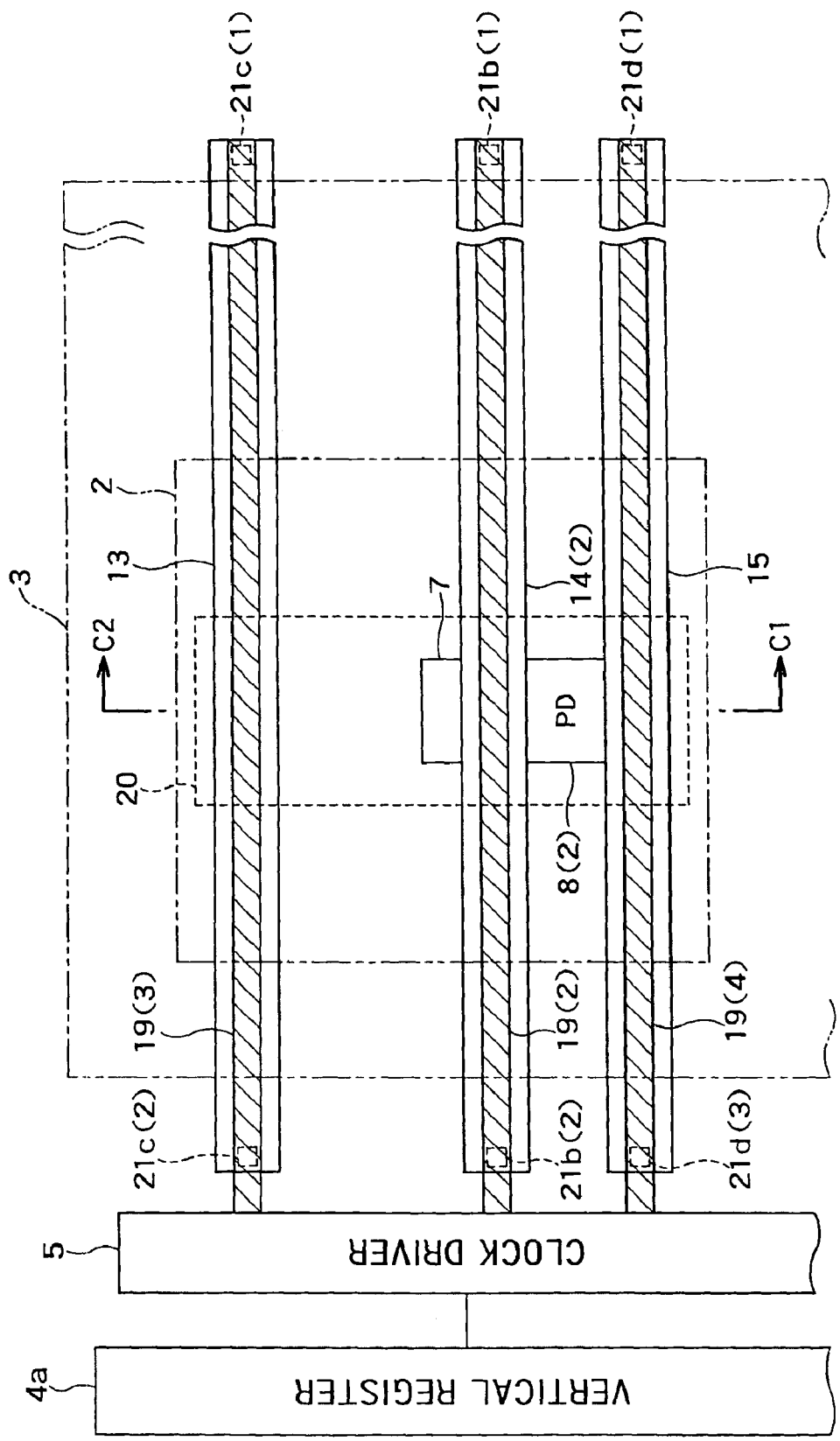
FIG. 9 is a plan view showing an exemplary configuration of a major portion of a single pixel of FIG. 8.

FIG. 9 is a plan view showing an exemplary structure of a major portion 20 of one of the pixels.

As shown in FIG. 8, each of pixels 2 in the CMOS sensor has a single photodiode 8 serving as a light receiving element and also has a single read-out transistor 10 to read out electric charge accumulated in the photodiode 8. A read-out line 14 is provided to activate the read-out transistor 10 which is connected to a sensing nods 7.

Configured in this manner, electric charge read out from the photodiode 8 is synthesized in the sensing node 7 and then fed as signals of electric charge to a gate of an amplification transistor 11 that is connected to the sensing node 7. Aluminum auxiliary wirings 19(1) to 19(4) are juxtaposed and electrically connected at lateral sides of the cell unit 3 with driving wirings that drive the pixels 2, namely, the read-out lines 14, the reset line 13, and the selection line 15. The remaining components are similar in structure and operation to their respective counterparts depicted in FIG. 1, and detailed descriptions of them will be omitted.

A practical deployment of the driving wirings, or the readout line 14, and the reset line 13, and the selection line 15 will be described with reference to FIG. 9 as follows.

As shown in FIG. 9, the reset line 13 and the read-out line 14 are symmetrical about the sensing unit interpolated at their respective extensions of centers, and the read-out line 14 and the selection line 15 are also symmetrical about the photodiode 8. The aluminum auxiliary wirings 19(1) to 19(4) are similarly provided symmetrically in relation to a deployment of their respective associated driving wirings.

An operation in such an arrangement of this embodiment is similar to that described in conjunction with FIG. 7, and therefore, an additional description will be omitted.

In an aspect of the third embodiment according to the present invention where the driving wirings and the aluminum auxiliary wirings are provided in a lateral symmetrical deployment about the photodiode, a CMOS sensor of enhanced uniformity in sensitivity can be provided to enable appropriate transmission of signals of reduced deterioration of clock waveform.

As has been recognized from the above statement, in accordance with embodiments of the present invention, the following features are attained.

Configured as having driver circuitries (i.e., a vertical register and a clock driver) simply on a single side of a cell unit (i.e., an image pickup unit), the device ensures that produced clock pulses keep stable amplitude, similar to an arrangement with the driver circuitries on opposite sides of the cell unit. Thus, without a further enlargement of chip area, the device permits the produced pulses to be sent to pixels disposed laterally opposite to the driver circuitries while avoiding possibly propagating voltage drop throughout their transmission passages.

The embodiments of the invention eliminate complicated treatments such as providing shunt wiring within a cell unit and accordingly takes away any further burden of necessarily forming numerous contacts, thereby retaining yield in the process.

Also, configured as having driver circuitries on one side of the image pickup unit where unit cells with opto-electrical converter elements are disposed in a two-dimensional array, the device is provided with auxiliary wirings of low resistance that are juxtaposed and electrically connected with associated driving wirings serving respectively to drive the unit cells in the same row all at once, and hence, the device permits produced clock pulses to be sent to the unit cells connected to the driving wirings without possible propagation of a deterioration of clock waveform. Thus, without a further enlargement of chip area, the device of enhanced performance during accelerated operation can be provided.

What is claimed is:

1. A solid-state imaging device, comprising:
an image pickup unit having unit cells including opto-electrical converter elements, said unit cells being disposed in a two-dimensional array,
a selection line made of polysilicon for selectively determining the unit cells in the same row within the image pickup unit,
a read-out line made of polysilicon for reading out an electric charge accumulated in the opto-electrical converter elements of the unit cells in the same row within the image pickup unit,
a signal line transmitting pixel signals produced from the unit cells in the same row within the image pickup unit,
a reset line made of polysilicon for discharging the unit cells in the same row within the image pickup unit down to a desired-voltage level,
a driver circuit located on one side of the image pickup unit for supplying drive signals to the read-out line, the selection line, and the reset line, respectively, and
a read-out auxiliary wiring disposed along at least the read-out line and electrically connected to the read-out line at a plurality of junctions, the read-out auxiliary wiring being of comparatively lower electric resistivity than the read-out line.

2. The solid-state imaging device according to claim 1, wherein the read-out auxiliary wiring is juxtaposed with the read-out line almost throughout its full length.

3. The solid-state imaging device according to claim 1, wherein the read-out auxiliary wiring is provided above the read-out line with an interlayer insulation film interposed therebetween.

4. The solid-state imaging device according to claim 1, wherein the read-out auxiliary wiring is connected to the read-out line at external lateral opposite sides of the image pickup unit, respectively.

5. The solid-state imaging device according to claim 1, wherein the read-out auxiliary wiring is made of metal primarily consisting of aluminum.

6. The solid-state imaging device according to claim 1, further comprising a reset auxiliary wiring, the reset auxiliary wiring being disposed along the reset line and electrically connected to the reset line, the reset auxiliary wiring being of comparatively lower electric resistivity than the reset line.

7. The solid-state imaging device according to claim 1, wherein the reset auxiliary wiring is made of metal primarily consisting of aluminum.

8. The solid-state imaging device according to claim 1, further comprising a selection auxiliary wiring, the selection auxiliary wiring being disposed along the selection line and electrically connected to the selection line, the selection auxiliary wiring being of comparatively lower electrical resistivity than the selection line.

9. The solid-state imaging device according to claim 1, wherein the selection auxiliary wiring is made of metal primarily consisting of aluminum.

10. The solid-state imaging device according to claim 1, wherein said read-out line, said reset line, said selection line and said read-out auxiliary wiring are provided in the same layer.

11. The solid-state imaging device according to claim 1, wherein said signal line is provided in a layer which is different from that in which said read-out auxiliary wiring is provided.

12. A solid-state imaging device, comprising:
an image pickup unit having unit cells including first and second opto-electrical converter elements, said unit cells being disposed in a two-dimensional array,
a selection line made of polysilicon for selectively determining the unit cells in the same row within the image pickup unit,
first and second read-out lines made of polysilicon for reading out an electric charge accumulated in the first and second opto-electrical converter elements of the unit cells in the same row within the image pickup unit, a signal line transmitting pixel signals produced from the unit cells in the same row within the image pickup unit, a reset line made of polysilicon for discharging the unit cells in the same row within the image pickup unit down to a desired voltage level, a driver circuit located on one side of the image pickup unit for supplying drive signals to the first and second read-out lines, the selection line, and the reset line, respectively, first and second read-out auxiliary wirings disposed along at least the first and second read-out lines, respectively, and electrically connected to the first and second read-out lines, respectively, the first and second read-out auxiliary wirings being of comparatively lower electric resistivity than the first and second read-out lines, respectively.

13. The solid-state imaging device according to claim 12, further comprising a reset auxiliary wiring and a selection auxiliary wiring, the reset auxiliary wiring and the selection auxiliary wiring being disposed along the reset line and the selection line, respectively, and electrically connected to the reset line and the selection line, respectively, at a plurality of junctions, respectively, the reset auxiliary wiring and the selection wiring being of comparatively lower electric resistivity than the reset line and the selection line, respectively.

14. The solid-state imaging device according to claim 13, wherein any pair of two activating lines of the first and second read-out lines, the reset line, and the selection line are disposed laterally symmetrical about the first opto-electrical converter element while another pair of the remaining lines are disposed laterally symmetrical about the second opto-electrical converter element.

15. The solid-state imaging device according to claim 14, wherein the first and second read-out auxiliary wiring, the reset auxiliary wiring, and the selection auxiliary wiring are all located in the same layer.

16. The solid-state imaging device according to claim 12, wherein said read-out line, said reset line, said selection line and said read-out auxiliary wiring are provided in the same layer.

17. The solid-state imaging device according to claim 12, wherein said signal line is provided in a layer which is different from that in which said read-out auxiliary wiring is provided.

18. A solid-state imaging device, comprising:

an image pickup unit having unit cells including opto-electrical converter elements, and a sensing unit to detect charges accumulated in the opto-electrical converter elements, said unit cells being disposed in a two-dimensional array, a selection line made of polysilicon for selectively determining the unit cells in the same row within the image pickup unit, a read-out line made of polysilicon for reading out an electric charge accumulated in the opto-electrical converter elements of the unit cells in the same row within the image pickup unit, a signal line transmitting pixel signals produced from the unit cells in the same row within the image pickup unit, a reset line made of polysilicon for discharging the unit cells in the same row within the image pickup unit down to a desired voltage level, a driver circuit located on one side of the image pickup unit for supplying drive signals to the read-out line, the selection line, and the reset line, respectively, and a read-out auxiliary wiring disposed along at least the read-out line and electrically connected to the read-out line at a plurality of junctions, the read-out auxiliary wiring being of comparatively lower electric resistivity than the read-out line;

said reset line and said read-out line being symmetrical about a sensing unit interpolated at their respective extensions of centers, and said read-out line and said selection line being symmetrical about the opto-electrical converter elements.

19. The solid-state imaging device according to claim 18, wherein the read-out auxiliary wiring is connected to the read-out line at external lateral opposite sides of the image pickup unit, respectively.

20. The solid-state imaging device according to claim 18, further comprising a reset auxiliary wiring and a selection auxiliary wiring, the reset auxiliary wiring and the selection auxiliary wiring being disposed along the reset line and the selection line, respectively, and electrically connected to the reset line and the selection line, respectively, at a plurality of junctions, respectively, the reset auxiliary wiring and the selection wiring being of relatively lower electric resistivity than the reset line and the selection line, respectively.

* * * * *